350-96.13 SR
XR 3,916,348

United St [11] 3,916,348
Toda et al. [45] Oct. 28, 1975

[54] TEMPERATURE-COMPENSATED SURFACE-PROPAGATED WAVE ENERGY DEVICE

[75] Inventors: Minoru Toda; Susumu Osaka, both of Machida, Japan

[73] Assignee: RCA Corporation, New York, N.Y.

[22] Filed: Jan. 31, 1975

[21] Appl. No.: 545,806

[52] U.S. Cl................... 333/30 R; 310/9.1; 333/72; 350/96 WG; 350/161

[51] Int. Cl.².. H03H 9/04; H03H 9/26; H03H 9/30; G02B 5/14

[58] Field of Search........... 310/8.9, 8, 9.1, 8.1, 9.4, 310/9.3, 9.5; 333/30 R, 72; 350/96 WG, 161

[56] References Cited

UNITED STATES PATENTS 3,723,915 3/1973 Adler et al. ....................... 333/30 R
3,786,373 1/1974 Schulz et al. ....................... 333/30 R

*Primary Examiner*—Eli Lieberman
*Assistant Examiner*—Marvin Nussbaum
*Attorney, Agent, or Firm*—G. H. Bruestle; D. S. Cohen

[57] ABSTRACT

An acoustic or optic surface-propagated wave energy device comprising a crystal having a surface along which energy is propagated and in which propagation path length changes and propagation velocity changes in the surface-wave which normally occur in response to temperature changes are compensated for by bending the crystal in response to bending of a bimetallic strip connected to the device.

6 Claims, 15 Drawing Figures

3916348
OR IN 333/30R

TEMPERATURE-COMPENSATED SURFACE-PROPAGATED WAVE ENERGY DEVICE

FIELD OF THE INVENTION

The present invention relates to acoustic or optic devices. More particularly, the present invention relates to surface-wave acoustic or optic devices with a temperature-compensating means.

BACKGROUND OF THE INVENTION

In a surface-wave acoustic delay device, delay is directly proportional to the length of the propagation path. Delay also depends upon wave propagation velocity, which decreases with increasing temperature for conventional piezoelectric crystals utilized in most acoustic wave delay devices.

In an optical surface-wave propagation device, which includes a crystal body, there is an optical phase difference for any two points along the propagation path. Since the propagation velocity (which is inversely proportional to the refractive index) is generally a function of the temperature, the phase difference between the optical waves at any two points along the propagation path is also temperature dependent.

Since these acoustical or optical devices expand or contract with temperature changes, their propagation path length changes in response to temperature changes to which the devices are subjected. However, it is usually undesirable to have such delay changes taking place in the normal operation of surface-wave devices.

There are also other optical devices, such as laser oscillators, which are dependent upon surface-wave propagation. The operation of these devices also depends upon the propagation path length, and the path length, in turn, is affected by changes in the ambient temperature.

It would be desirable in these surface-wave propagation devices to have some means of compensating for the effects of temperature changes such that any tendency for the length of the energy propagation path to increase or decrease, or for propagation velocity to change, with changes in temperature would automatically be compensated for.

SUMMARY OF THE INVENTION

The present invention comprises means in association with the above devices for automatically changing surface-wave propagation path length in response to temperature changes, in such a manner that changes due to an increase or decrease in the dimensions of the propagation medium and due to an increase or decrease in propagation velocity, are compensated for. The compensating means comprises one or more bimetallic strips so connected to the surface-wave propagation medium that curvature changes in the strip or strips brought about by temperature changes in the environment, cause corresponding changes in the curvature of the crystal and hence changes in the length of the surface-wave propagation path.

THE DRAWING

DESCRIPTION OF PREFERRED EMBODIMENTS

Figure 1:
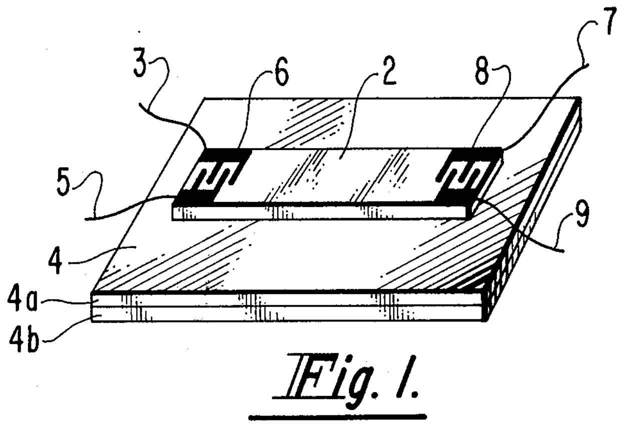
FIG. 1 is an isometric view of one embodiment of a surface-wave device of the present invention, including a bimetallic strip.
Figure 2:
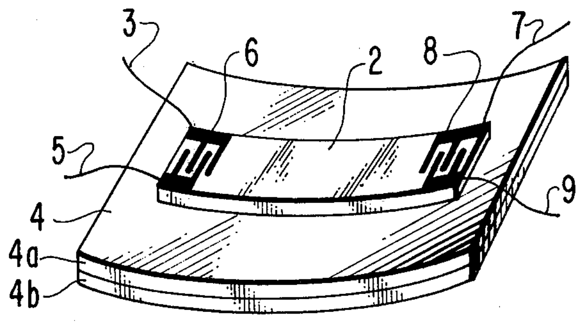
FIGS. 2 and 3 are similar views of the device of FIG. 1 when subjected to an increase in temperature and a decrease in temperature, respectively.
Figure 3:
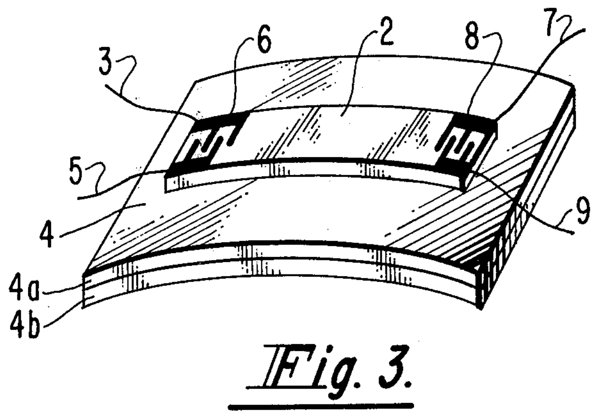

The simplest type of delay device of the present invention is illustrated in FIGS. 1–3. It comprises a rectangular parallelepiped-shaped crystal body 2 (FIG. 1) of a piezoelectric material, such as $LiNbO_3$, cemented to a strip 4 of a bimetallic material. Other piezoelectric materials which may be used include quartz, barium niobate, and the like. The bimetallic material is of a conventional type composed of layers 4*a* and 4*b* of two different metals having different temperatures coefficients of expansion. Examples of suitable commercially available strips are Truflex P675R of Texas Instruments, Clark, New Jersey, and No. 6650 of the Chase Co., Philadelphia, Pa. When the metals are subjected to an increase in temperature, one metal lengthens more than the other metal and the strip bends by a certain amount depending on what metals are used and what the temperature change is. The top surface of the crystal body 2 has interdigitated electrodes 6 and 8 at opposite ends thereof for application of an electrical signal and detection of the signal after it has reached the opposite end of the crystal. Lead wires 3 and 5, 7 and 9 are attached to the electrodes 6 and 8, respectively. (In subsequent figures, the lead wires have been omitted.)

When a delay device, such as that described above, is subjected to an increase in temperature, the crystal lengthens somewhat. This increase in length, together with a decrease in propagation velocity cause an increase in the delay time of the surface-propagated acoustic waves. Such changes are undesirable in normal device operation. However, when the temperature rises, the bimetallic strip 4 bends. If the strip 4 is oriented properly, such that metal layer 4*a* to which the crystal 2 is cemented, has a lower coefficient of expansion than layer 4*b*, the layer 4*a* takes a concave shape (FIG. 2) and the crystal body 2 is caused to bend similarly. This shortens the path between the electrodes 6 and 8 and tends to compensate for both the lengthening of the crystal body 2 and the decrease in propagation velocity.

If a decrease in temperature is being compensated for, the bimetallic strip 4 bends so that the top surface of layer 4*a* takes a convex shape (FIG. 3). This causes the crystal body 2 to assume a similar convex shape and the propagation path between electrodes 6 and 8 lengthens. The lengthening of the path tends to counteract the effect of shortening the crystal body and the increase in propagation velocity that normally accompany a decrease in temperature.

Generally, it has been found that a single, thin bimetallic plate provides a sufficiently large bending arc to compensate for temperature changes in a $LiNbO_3$ crystal but the bending moment of force exerted on the crystal body by a single plate is not large enough to bend the crystal body sufficiently to completely compensate for the temperature change. Only a partial compensation has been accomplished by this means with a $LiNbO_3$ crystal. More complete compensation may be obtained with other crystal materials.

Possible ways to increase the bending moment are to increase either the width or the thickness of the bimetallic plate. However, it has been observed that the thermal bending of a bimetallic plate decreases as the thickness is increased and the width of the plate cannot be appreciably increased if the size of the equipment is to be kept small.

The present invention solves the problem by utilizing any one of several mechanical structures. There are devices other than the specific structures recited hereinafter which can incorporate the present invention. Therefore, it is understood that the invention is not limited to the specific mechanical embodiments described below.

Figure 4:
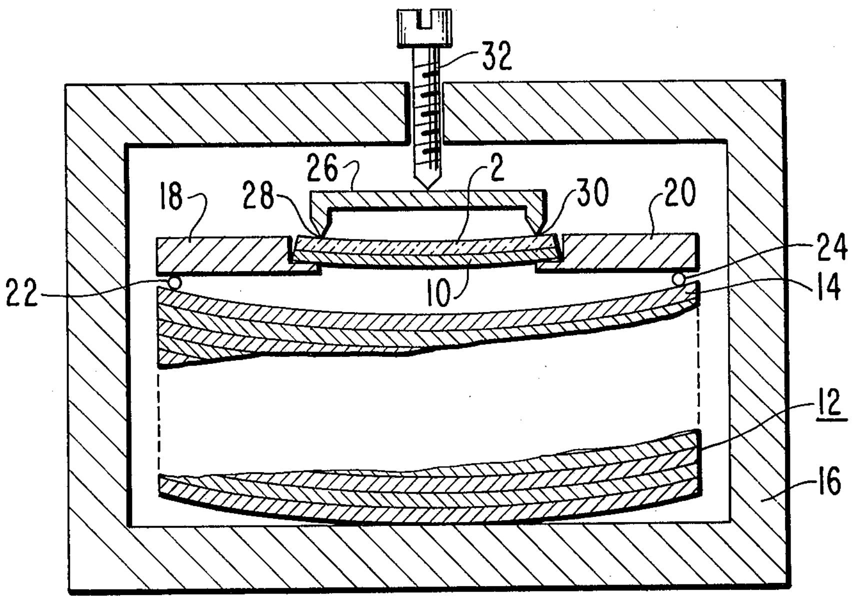
FIGS. 4 and 5 are cross-section views of devices with alternative arrangements of a plurality of bimetallic strips.

One of these embodiments mounts the crystal body 2 on top of a stack of thin bimetallic strips 12 (FIG. 4). In this structure, all of the strips 12 contribute to give a larger bending moment than that possible from one bimetallic strip. First, however, in order to prevent cracking of the crystal body 2 due to bending, it is preferably mounted on a metal backing strip 10.

The embodiment illustrated in FIG. 4 comprises a stack 12 of bimetallic strips 14 each having a width of 14.5 mm and a thickness of 0.2mm. The number of strips 14 actually used in an experimental device was 42. The stack 12 is mounted within a small metal box 16. The strips 14 are held together by bolts (not shown).

A crystal body 2 and metal backing plate 10 are cemented on and mounted between two spaced apart lever plates 18 and 20. The corresponding surfaces of the lever plates 18 and 20 are disposed in the same plane, and the outer edges of the lever plates 18 and 20 rest on the outer ends of the top strip of the strip stack 12 through thin rods 22 and 24 which function as fulcrums.

On top of the crystal body 2 rests a fulcrum plate 26 having ridge-shaped knife-edge fulcrums 28 and 30 extending downward at either end. The knife-edge fulcrums 28 and 30 rest on the top surface of the crystal body 2 adjacent opposite ends thereof. The bottom end of a screw 32, threadedly mounted in the top of the box 16, presses against the center of the fulcrum plate 26. The lever arm length between fulcrums 22 and 28 (and between fulcrums 24 and 30) was 10 mm. in an experimental device.

The strips 14 are so oriented, all in the same direction, that an increase in temperature causes the stack of strips 12 to assume a concave shape as shown in FIG. 4. The outer edges of the lever plates 18 and 20 are forced upward and this, in turn, causes the crystal body 2 to bend concavely. In this and in subsequent embodiments, the interdigitated electrodes 6 and 8 on the surface of the crystal body 2 are spaced sufficiently from the ends of the body so that fulcrums and other suspending means do not interfere with the electrodes.

Although this structure provided an improved compensation for temperature increases, compared to use of a single bimetallic plate, it did not provide complete compensation, probably due to friction between the plates.

Although normally the backing plate 10 is flat at room temperature, the backing plate can be used to aid the bimetallic strips to bend a crystal convexly when the temperature decreases. This can be done by bowing the backing plate convexly at room temperature before the crystal body is mounted on it. At normal operating temperature, above room temperature, the adjusting screw is tightened to make the crystal and the backing plate flat. Then, if the temperature decreases, the backing plate will try to assume its former convex form by spring action. It will thus aid the bimetallic strip. A preferred metal for the backing plate is steel.

Figure 5:
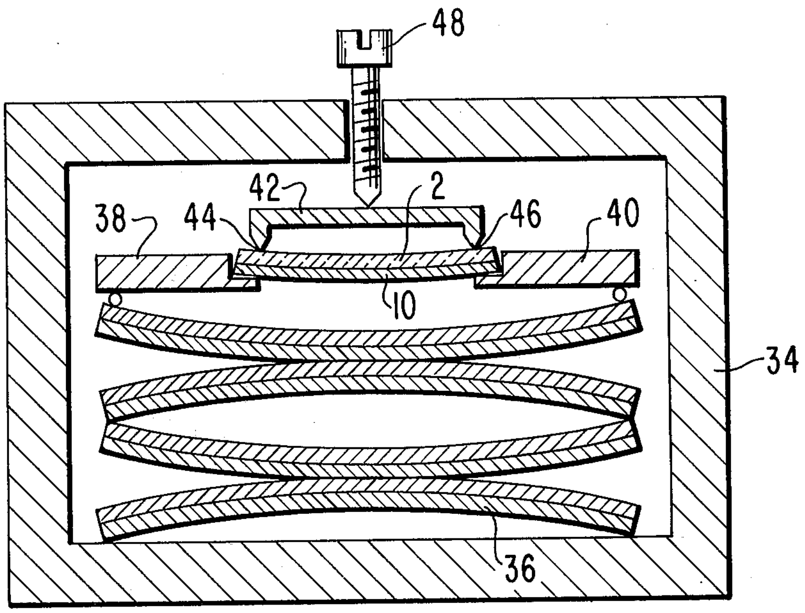

A more satisfactory structure is illustrated in FIG. 5. This structure comprises a metal enclosure 34 within which is a plurality of bimetal strips 36 each having a length of 34.5 mm, a width of 14.5 mm and a thickness of 1.2 mm. In one example, six strips were used (four are illustrated). The strips 36 are arranged such that they are stacked with alternate strips orientated in the same direction and such that the top strip bends in a concave direction when the temperature is increased (as shown in the drawing).

As in the structure of FIG. 4, the composite unit composed of a crystal body 2 and a backing plate 10 is mounted between lever plates 38 and 40 having corresponding surfaces extending in the same plane. A fulcrum plate 42 having two knife edge fulcrums 44 and 46, rests on the top surface of the crystal body 2. A screw 48, threadedly mounted in the top wall of the enclosure 34, presses on the middle of the fulcrum plate 42.

Using the above-described structure, the thermobending of each strip 36 is additive so that the amount that the crystal body 2 is bent for a given rise in temperature, is greater than that for any of the previously illustrated embodiments.

The screw 48 is used to adjust the working temperature range. When the screw 48 is tightened, the temperature range is shifted toward lower temperatures. When the screw 48 is loosened, the temperature range is shifted toward higher values. As in the previous example, the lever arms of the lever plates 38 and 40 were each 10 mm long in an experimental device.

Figure 6:
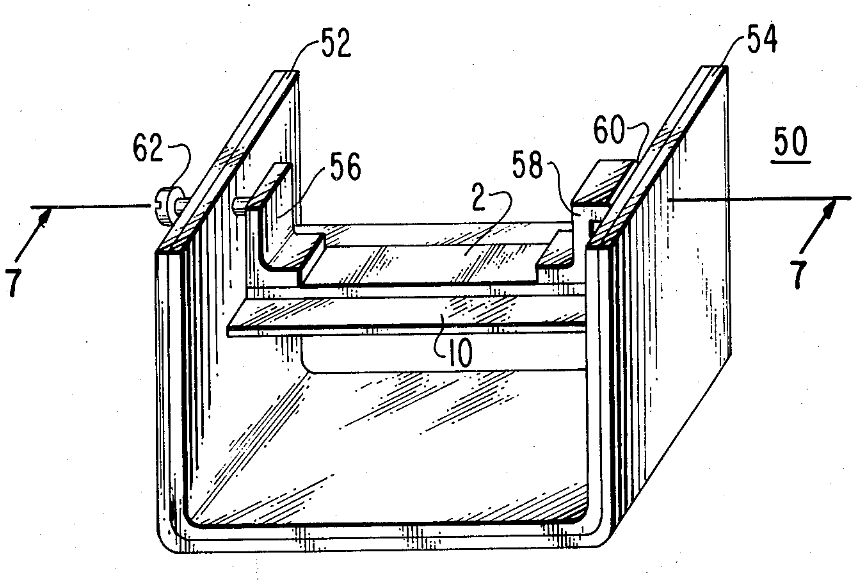
FIG. 6 is an isometric view of a device utilizing a different configuration of a single bimetallic strip.
Figure 7:
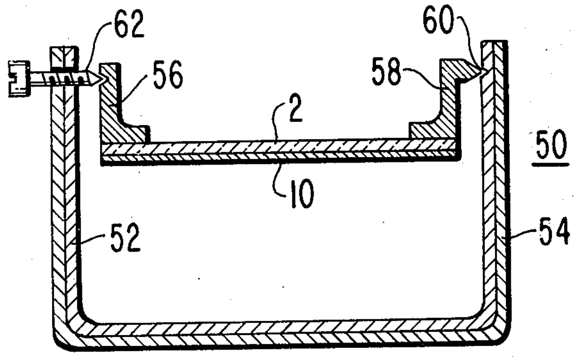
FIG. 7 is a cross-section view taken along the line 7—7 of FIG. 6.

To obtain a desirably large bending moment and mechanical strain on the surface of the surface-wave propagation medium, a lever structure like that of FIGS. 6 and 7 may be used. This structure comprises a "U"-shaped bimetallic strip 50 oriented such that an increase in temperature causes the vertical legs 52 and 54 of the strip 50 to bend toward each other. A crystal body 2 mounted on a backing plate 10 is suspended between the legs 52 and 54 of the "U"-shaped bimetallic strip 50. More specifically, a composite unit composed of a crystal body 2 and backing plate 10 is cemented to the pediments of each of two L-shaped lever arms 56 and 58. One end of one of the lever arms presses against the point of an adjusting screw 62 threadedly mounted near the upper end of one of the vertical legs 52 of the bimetallic strip 50. One end of the other lever arm 58 has a knife-edge fulcrum 60 pressing against a groove near the upper end of the other vertical leg 54 of the bimetallic strip 50. In this structure, when the legs 52 and 54 of the bimetallic strip 50 bend in response to increased or decreased temperatures the crystal body 2 bends concavely or convexly.

Figure 8:
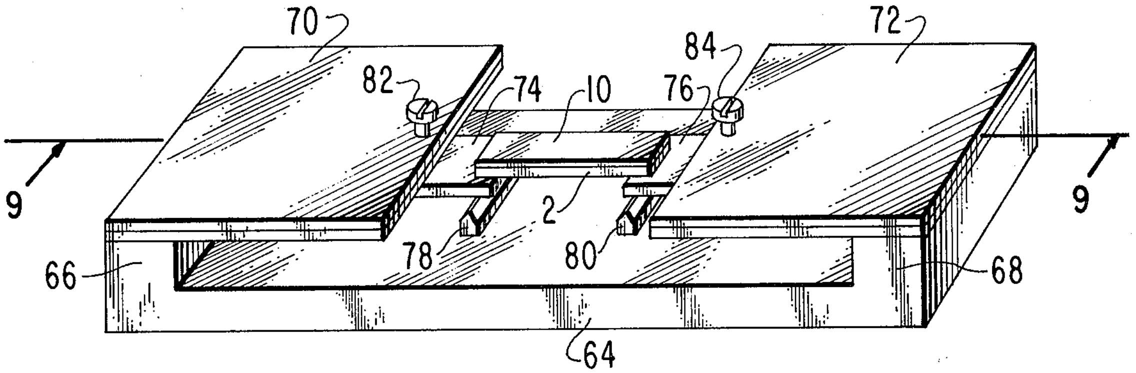
FIG. 8 is an isometric view of a device utilizing two bimetallic stripes.
Figure 9:
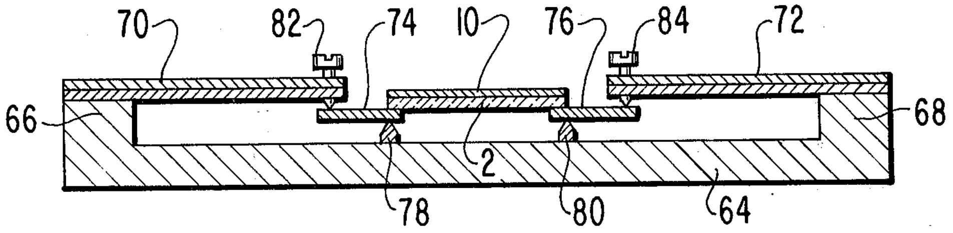
FIG. 9 is a cross-section view taken along the line 9—9 of FIG. 8.

Another structure for obtaining a large bending moment is illustrated in FIGS. 8 and 9. This structure comprises a platform 64 having vertical supports 66 and 68. A bimetallic plate 70 and 72, is horizontally extended from each support 66 and 68, respectively. The bimetallic plates 70 and 72 extend toward each other with corresponding surfaces in the same plane.

A composite unit composed of a crystal body 2 and a metal backing plate 10 (with a crystal body 2 on the bottom) is cemented to and suspended between two lever arms 74 and 76 resting on knife-edge fulcrums 78 and 80, respectively, which are supported on the platform 64. The fulcrums 78 and 80 are placed beneath the ends of the crystal body 2.

Two additional fulcrums, which comprise screws 82 and 84, press down on the ends of the lever arms 74 and 76, respectively, opposite the ends on which the composite unit composed of a crystal body 2 and a backing plate 10 is suspended. The screws 82 and 84 are threadedly mounted in the free ends of the bimetallic plates 70 and 72, respectively.

A rise in temperature causes the free ends of the bimetallic plates 70 and 72 to bend downward and the screws 82 and 84 to press downward to one end of each lever arm 74 and 76. The lever arms 74 and 76 pivot around fulcrums 78 and 80 causing the crystal body 2 to bend convexly. However, since the electrodes of the acoustic wave device will now be on the bottom surface of the crystal body 2, the propagation path will be curved concavely. For a decrease in temperature, the parts move in the opposite direction, which causes the propagation path to assume a convex shape.

In the devices illustrated in FIGS. 4–9, changes in the degree of compensation can be accomplished by changing the lengths of the lever arms.

Almost complete temperature compensation has been achieved with the devices illustrated in FIGS. 5–9.

When these devices are used in environments where rapid temperature variations occur, means should be provided for good heat transfer between the crystal body and the bi-metallic plates in order to avoid large temperature differences between the objects. Mechanical stops can be used to protect the devices from breakage which might be caused by temperature changes above their operating range. In general, the devices illustrated are intended to be operated at temperatures within 20° or 25° Centigrade of room temperature, i.e., 0° to 40°C.

The devices illustrated are suitable for apparatus such as TV-IF filters.

The principles of the present invention may also be applied to optical devices comprising a thin film of a single crystal, high refractive index, light-transmitting material on a substrate of lower refractive index material.

Figure 10:
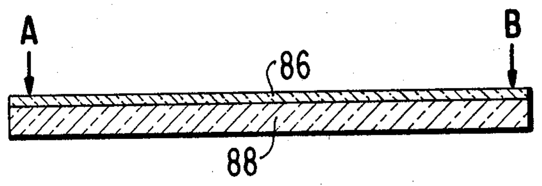
FIGS. 10–12 are cross-section views of a thin-film optical wave propagation device such as may be improved by the use of the present invention.

For example, (FIG. 10) a thin layer 86 of single crystal $LiNbO_3$ may be grown on a substrate 88 of single crystal $LiTaO_3$. When light is propagated horizontally through the thin layer 86 there is a phase difference between any two points along the layer such as A and B. Since the light propagation velocity (which is inversely proportional to the refractive index of the propagation medium) is a function of temperature, the phase difference between A and B is also temperature dependent.

Figure 11:
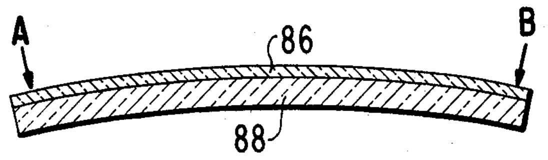
Figure 12:
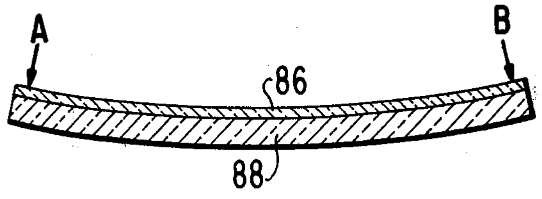

The phase change caused by changing temperature can be compensated for by changing the distance between A and B. For example, the distance can be lengthened by bending the structure in a convex manner as shown in FIG. 11, or the distance can be shortened by bending it in a concave manner as shown in FIG. 12.

Bending the propagation path in response to temperature changes can be accomplished with the same arrangements of bimetallic strips as previously disclosed. Light can be coupled into and out of the propagation path with optical fibers (not shown) cemented to the crystal face.

Figure 13:
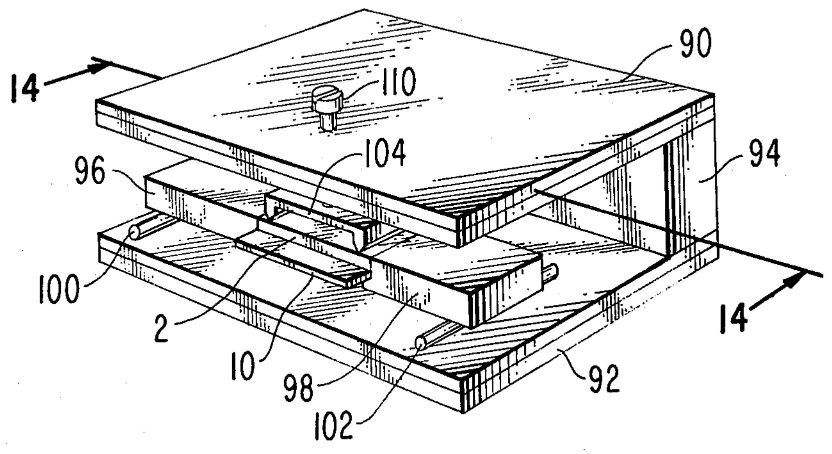
FIG. 13 is an isometric view of still another surface-wave propagation device of the present invention.
Figure 14:
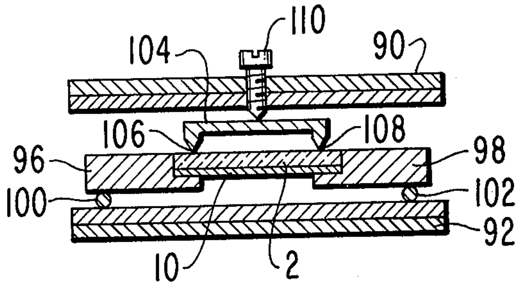
FIG. 14 is a cross-section view taken along the line 14—14 of FIG. 13.
Figure 15:
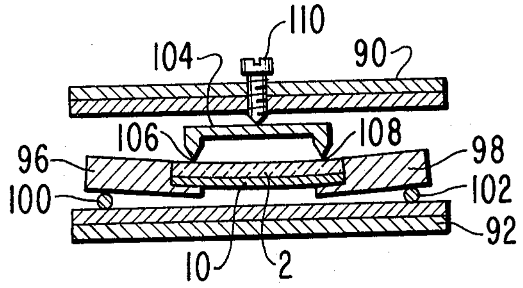
FIG. 15 is a cross-section view of the device of FIGS. 13 and 14 with compensation occurring.

Still another arrangement of bimetallic strips that can be used to compensate for temperature changes in either an acoustic or an optic surface-propagated wave energy device, is illustrated in FIGS. 13–15. This embodiment is compact and efficient. This device (FIG. 13) comprises a pair of bimetallic strips 90 and 92 oriented parallel to each other, with similar metal surfaces facing each other. One end of each strip 90 and 92 is attached to a mounting block 94 and an opposite end of each strip 90 and 92 is freely suspended from the mounting block 94.

A crystal body 2, cemented to a metal backing plate 10, is mounted on and between two lever plates 96 and 98. One end of each of the lever plates 96 and 98 rests on a fulcrum rod 100 and 102, respectively, which, in turn, is mounted on one of the bimetallic strips 92. A fulcrum plate 104 with knife-edge fulcrums 106 and 108 (FIG. 14) at opposite ends thereof, rests on the top surface of the crystal body 2 such that the knife edges press on the crystal surface. A screw 110 is threadedly mounted near the free edge of the bimetal strip 90. The end of the screw 110 rests on the center of the fulcrum plate 104. The adjusting function of the screw 110 is similar to that of screws in the previously described embodiments. When the bimetallic strips 90 and 92 are suitably oriented, an increase in temperature causes these strips to bend toward each other. This action causes the crystal body 2 to bend concavely as shown in FIG. 15.

We claim:

1. A temperature-compensating surface-propagated wave energy device comprising:

a crystal which is capable of propagating energy waves along a propagation path on a surface of said crystal, the length of said propagation path being dependent upon the temperatures to which said crystal is subjected, bimetallic strip means of a type capable of bending to a degree directly proportionate to a particular temperature to which said strip means is subjected, and means connecting said bimetallic strip means to said crystal such that bending of said strip means causes bending of said crystal to change the length of said propagation path in a manner to compensate for dimensional changes in the length of said path due to temperature changes.

2. A device according to claim 1 in which said bimetallic strip means comprises a stack of bimetallic strips wherein alternate strips are orientated in the same direction.

3. A device according to claim 1 in which said bimetallic strip means has a "U"-shape and said crystal is suspended between the legs of the "U."

4. A device according to claim 1 in which said bimetallic strip means consists of two said strips each being suspended with corresponding surfaces in the same plane, at one end thereof, and in which said crystal is mounted between the ends of said strips opposite to the ends from which they are suspended.

5. A device according to claim 1 in which said crystal comprises a thin film of a single crystal, high refractive index, light-transmitting material grown on a substrate of lower refractive index material.

6. A device according to claim 1 in which said bimetallic strip means comprises two of said strips having similar sides facing each other, said strips being disposed with corresponding surfaces in parallel planes with one end of each strip rigidly mounted and the other end of each strip free to move, said crystal being mounted between said free ends of said strips such that it bends in response to movement of said free ends of said strips toward each other.

* * * * *